(12) United States Patent
Chen et al.

(10) Patent No.: US 9,490,290 B2
(45) Date of Patent: Nov. 8, 2016

(54) BACK SIDE ILLUMINATED SEMICONDUCTOR STRUCTURE WITH SEMICONDUCTOR CAPACITOR CONNECTED TO FLOATING DIFFUSION NODE

(71) Applicant: PIXART IMAGING INC., Hsin-Chu County (TW)

(72) Inventors: Ching-Wei Chen, Hsin-Chu County (TW); Wen-Cheng Yen, Hsin-Chu County (TW)

(73) Assignee: Pixart Imaging Inc., Hsin-Chu County (TW)

( * ) Notice: Subject to any disclaimer, the term of this patent is extended or adjusted under 35 U.S.C. 154(b) by 0 days.

(21) Appl. No.: 14/659,956

(22) Filed: Mar. 17, 2015

(65) Prior Publication Data

US 2015/0380448 A1 Dec. 31, 2015

(30) Foreign Application Priority Data

Jun. 26, 2014 (TW) .............................. 103122206 A
Nov. 3, 2014 (TW) .............................. 103138137 A

(51) Int. Cl.
*H01L 27/146* (2006.01)

(52) U.S. Cl.
CPC ..... *H01L 27/1464* (2013.01); *H01L 27/14609* (2013.01); *H01L 27/14629* (2013.01)

(58) Field of Classification Search
CPC ............. H01L 27/148; H01L 27/1464; H01L 27/14609
USPC ......................................... 257/292, E27.133
See application file for complete search history.

(56) References Cited

U.S. PATENT DOCUMENTS

| 5,565,676 A | * | 10/1996 | Tanabe et al. | ................. 250/340 |
| 2009/0201400 A1 | * | 8/2009 | Zhang et al. | ................. 348/296 |
| 2013/0214371 A1 | * | 8/2013 | Asatsuma | ......... H01L 31/02325 257/432 |

* cited by examiner

*Primary Examiner* — Marc Armand
(74) *Attorney, Agent, or Firm* — Rosenberg, Klein & Lee

(57) ABSTRACT

There is provided a back side illuminated semiconductor structure with a semiconductor capacitor connected to a floating diffusion node in which the semiconductor capacitor for reducing a dimension of the floating diffusion node is provided above the floating diffusion node so as to eliminate the influence thereto by incident light and enhance the light absorption efficiency.

17 Claims, 3 Drawing Sheets

BACK SIDE ILLUMINATED SEMICONDUCTOR STRUCTURE WITH SEMICONDUCTOR CAPACITOR CONNECTED TO FLOATING DIFFUSION NODE

RELATED APPLICATIONS

The present application is based on and claims priority to Taiwanese Application Number 103122206, Jun. 26, 2014 and Taiwanese Application Number 103138137, Nov. 3, 2014, the disclosure of which are hereby incorporated by reference herein in their entirety.

BACKGROUND

1. Field of the Disclosure

This disclosure generally relates to an optical semiconductor structure and, more particularly, to a back side illuminated semiconductor structure with a semiconductor capacitor connected to a floating diffusion node.

2. Description of the Related Art

Conventionally, a floating diffusion node of a back side illuminated semiconductor structure should be large enough such that an equivalent capacitance of the floating diffusion node can be used to store charges after a light sensing region of the light sensing device generates the charges.

However, in the back side illuminated semiconductor structure, as the floating diffusion node is also within an illuminated region of incident light and, unlike the front side illuminated semiconductor structure, does not have a shielding structure consisted of the metal layer, the photoelectric effect also occurs in the floating diffusion node due to the incident light such that the identification to light sensing signals is disturbed and the signal-to-noise ratio is degraded.

In order to reduce the influence to the floating diffusion node by the incident light, conventionally a dimension of the floating diffusion node is reduced as much as possible so as to avoid too much incident light to be received by the floating diffusion node. However, if the dimension of the floating diffusion node is reduced, the equivalent capacitance thereof is decreased as well such that the signal-to-noise ratio is degraded.

SUMMARY

One object of the present disclosure is to provide a back side illuminated semiconductor structure with a semiconductor capacitor connected to a floating diffusion node. By reducing a dimension of the floating diffusion node and forming a semiconductor capacitor above and connected to the floating diffusion node, the unnecessary photoelectric effect in the floating diffusion node when receiving incident light is avoided. Meanwhile, as the semiconductor capacitor is connected to the floating diffusion node, a required equivalent capacitance of the floating diffusion node is maintained.

Another object of the present disclosure is to provide a back side illuminated semiconductor structure with a semiconductor capacitor connected to a floating diffusion node in which the semiconductor capacitor connected to the floating diffusion node is provided close to the floating diffusion node so as to reduce a total size of the floating diffusion node and keep an enough equivalent capacitance of the floating diffusion node as well. Furthermore, a capacitor having a metal electrode is selected, such as a metal-insulator-metal (MIM) capacitor. The metal electrode is used to reflect light not being absorbed by a light sensing device in the first penetration back to the light sensing device so as to improve the light absorption efficiency.

To achieve the above object, the present disclosure provides a back side illuminated semiconductor structure including a substrate, a light sensing region, a floating diffusion node, a transfer gate and a semiconductor capacitor. The substrate has a light receiving surface. The light sensing region is inside the substrate and configured to receive light penetrating the substrate from the light receiving surface to generate photo-generated charges by a photoelectric effect. The floating diffusion node is inside the substrate and configured to temporarily store the photo-generated charges generated by the light sensing region. The transfer gate is connected to the light sensing region and the floating diffusion node, and configured to control the photo-generated charges generated by the light sensing region to flow to the floating diffusion node. The semiconductor capacitor is electrically connected to the floating diffusion node, has an overlapping region with the light sensing region and is configured to temporarily store the photo-generated charges generated by the light sensing region together with the floating diffusion node, and the semiconductor capacitor includes a light reflection layer.

The present disclosure further provides a back side illuminated semiconductor structure including a substrate, a light sensing region, a floating diffusion node, a transfer gate and a metal-insulator-metal capacitor. The substrate has a light receiving surface. The light sensing region is inside the substrate and configured to receive light penetrating the substrate from the light receiving surface to generate photo-generated charges by a photoelectric effect. The floating diffusion node is inside the substrate and configured to temporarily store the photo-generated charges generated by the light sensing region. The transfer gate is connected to the light sensing region and the floating diffusion node, and configured to control the photo-generated charges generated by the light sensing region to flow to the floating diffusion node. The metal-insulator-metal capacitor is electrically connected to the floating diffusion node and configured to temporarily store the photo-generated charges generated by the light sensing region together with the floating diffusion node.

The present disclosure further provides a back side illuminated semiconductor structure including a substrate, a light sensing region, a floating diffusion node, a transfer gate and a semiconductor capacitor. The substrate has a light receiving surface. The light sensing region is inside the substrate and configured to receive light penetrating the substrate from the light receiving surface to generate photo-generated charges by a photoelectric effect. The floating diffusion node is inside the substrate and configured to temporarily store the photo-generated charges generated by the light sensing region. The transfer gate is connected to the light sensing region and the floating diffusion node, and configured to control the photo-generated charges generated by the light sensing region to flow to the floating diffusion node. The semiconductor capacitor is electrically connected to the floating diffusion node through a contact and configured to temporarily store the photo-generated charges generated by the light sensing region together with the floating diffusion node, and a cross section of the floating diffusion node is 4 to 5 times of that of the contact.

In another embodiment, the semiconductor capacitor of the present disclosure has an electrode consisted of a metal layer which is disposed behind or close to a periphery of a light sensing region of a light sensing device so as to reflect light not being absorbed in the first penetration back to the light sensing region thereby improving the light absorption efficiency of the light sensing device.

BRIEF DESCRIPTION OF THE DRAWINGS

Applications of the present disclosure will become more apparent from the following detailed descriptions.

DETAILED DESCRIPTION OF THE EMBODIMENT

Figure 1:
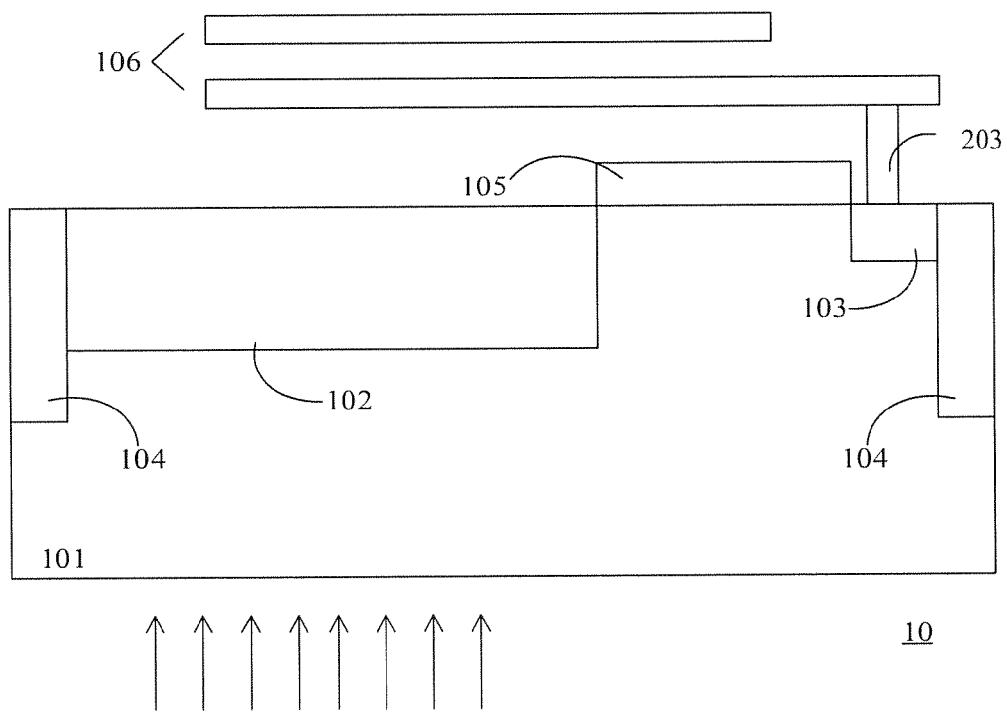
FIG. 1 is a schematic diagram of the present disclosure.

It should be noted that in the drawings herein elements not directly related to the present disclosure are omitted. Meanwhile, in order to obviously show the relationship between elements, the ratio between elements in the drawings is not necessary to be identical to that between actual elements.

Referring to FIG. 1, it is a schematic diagram of the present disclosure. A back side illuminated semiconductor structure 10 includes a substrate 101, a light sensing region 102, a floating diffusion node 103, a blocking region 104, a transfer gate 105 and a semiconductor capacitor 106, wherein the substrate 101 has a light receiving surface configured to receive incident light. The light sensing region 102 is inside the substrate 101 and configured to receive light penetrating the substrate 101 from the light receiving surface to generate photo-generated charges by a photoelectric effect. The blocking region 104 is configured to block the charges not to flow to other areas. The transfer gate 105 is connected between the light sensing region 102 and the floating diffusion node 103, and configured to control, including total charges and the flow rate, the photo-generated charges generated by the light sensing region 102 to flow to the floating diffusion node 103. In the complementary metal oxide semiconductor (CMOS) process, the transfer gate 105 is a voltage-controlled gate, and when a proper voltage is provided thereto, charges are allowed to flow through the region therebelow. The floating diffusion node 103 and the semiconductor capacitor 106 connected thereto are both temporarily configured to store the photo-generated charges generated by the light sensing region 102 to be used later. In one embodiment, the floating diffusion node 103 is inside the substrate 101, and the semiconductor capacitor 106 is formed in a metal stack layer.

Figure 3:
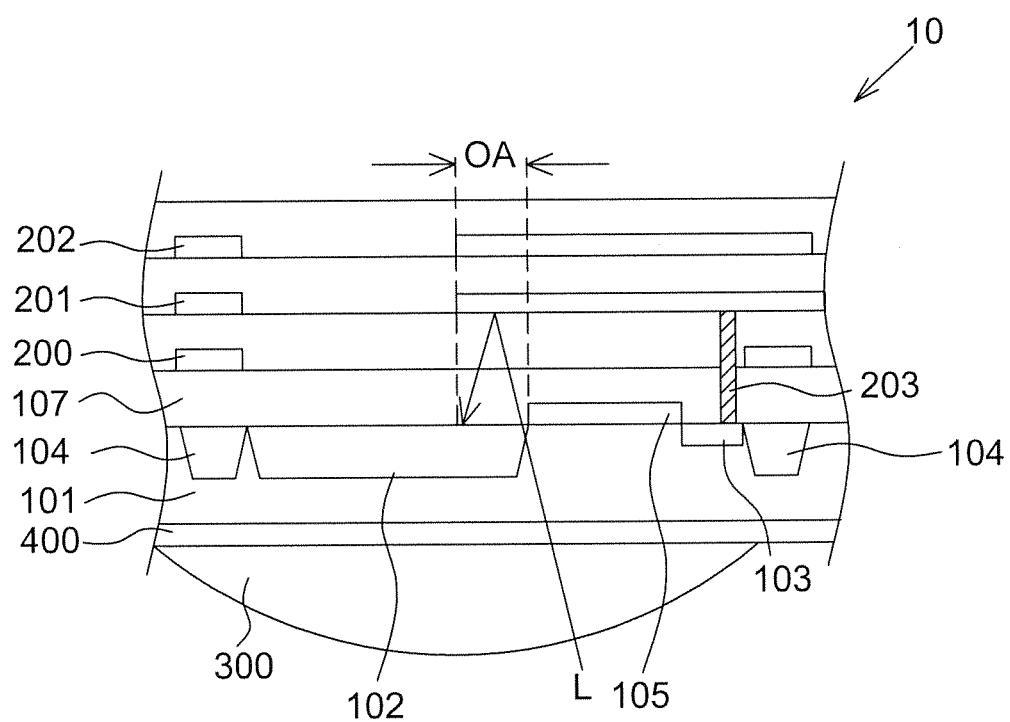
FIG. 3 is a cross-sectional view of a back side illuminated semiconductor structure according to one embodiment of the present disclosure.

Referring to FIG. 3, it is a cross-sectional view of a back side illuminated semiconductor structure 10 according to one embodiment of the present disclosure. The metal stack layer includes patterned metal layers such as a first metal layer 200, a second metal layer 201 and a third metal layer 202, wherein the first metal layer 200 may be referred to the M1 metal layer which is a metal layer in the metal stack layer closest to the substrate 101. And a dielectric layer 107 may be formed between the first metal layer 200 and the substrate 101. In one embodiment, the semiconductor capacitor 106 is formed by two metal layers of the metal stack layer, e.g. the second metal layer 201 and the third metal layer 202, but not formed in the first metal layer 200 which is closest to the substrate 101 in the metal stack layer. It should be mentioned that although FIG. 3 shows that a metal stack layer includes three metal layers, but the present disclosure is not limited thereto. A number of metal layers included in the metal stack layer may be determined according to different applications and without particular limitations.

Referring to FIG. 1 again, by forming the semiconductor capacitor 106, a dimension of the floating diffusion node 103 is reduced, e.g. a cross section thereof being reduced to be smaller than 20% of that of the light sensing region 102. For example, the semiconductor capacitor 106 is electrically connected to the floating diffusion node 103 via a contact 203, and a cross section of the floating diffusion node 103 is 4 to 5 times of that of the contact 203 so as to reduce the influence of the photoelectric effect in the floating diffusion node 103 caused by incident light. In this embodiment, as the semiconductor capacitor 106 connected to the floating diffusion node 103 is provided, an enough equivalent capacitance is maintained for storing photo-generated charges generated by the light sensing region 102 and the signal-to-noise ratio (SNR) is improved. The actual capacitance may be designed according to different requirements and the material adaptable to the semiconductor capacitor may be selected without particular limitations.

For example, the semiconductor capacitor may be a metal-insulator-metal (MIM) capacitor, a polysilicon-insulator-polysilicon (PIP) capacitor, a metal oxide semiconductor (MOS) capacitor, a metal-oxide-metal (MOM) capacitor, but not limited thereto.

Figure 2:
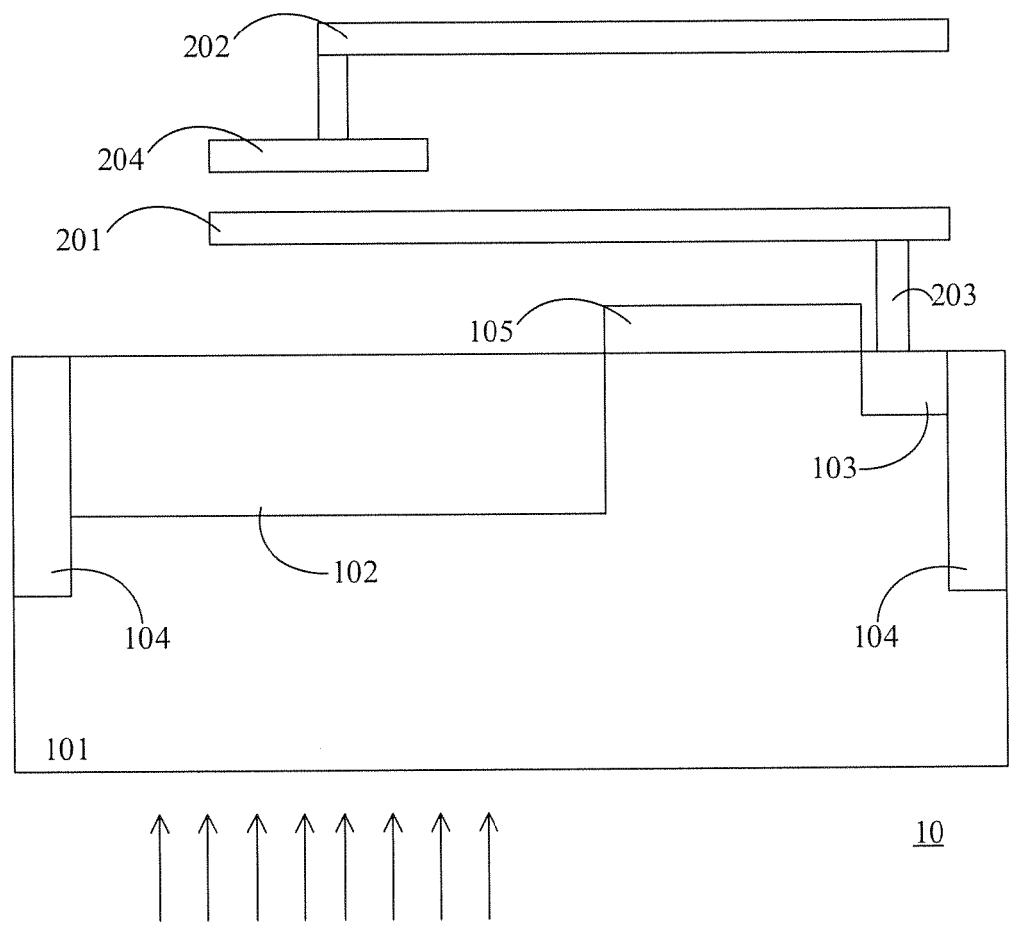
FIG. 2 is one embodiment of the present disclosure.

FIG. 2 further shows one embodiment of the present disclosure, and a MIM capacitor is taken as an example herein for illustrating the semiconductor capacitor. In this embodiment, the metal layer 201 is electrically connected to the floating diffusion node 103 via a contact 203 so as to form one electrode of the semiconductor capacitor. Another electrode of the semiconductor capacitor is a conductive material layer 204 which is between the metal layer 202 and the metal layer 201. Accordingly, the metal layer 201 and the conductive material layer 204 form a MIM capacitor, and a dielectric material layer is arranged therebetween. In this embodiment, the metal layer 201 is shown to be formed behind the light sensing region 102 to accordingly reflect light not being absorbed in the first penetration back to the light sensing region 102 so as to improve the light absorption efficiency of the light sensing device (e.g. the photodiode) included therein. In other words, in this embodiment one metal electrode of the MIM capacitor is served as a light reflection layer. In addition, in this embodiment the material of the conductive material layer 204 is selected as metal so as to form the MIM capacitor structure. In other embodiments, the material of the conductive material layer 204 may be other materials such as poly or other conductive materials that do not affect the light reflection effect of the metal layer 201.

In one embodiment, the metal layer 201 overlaps with at least 30% area of the light sensing region 201, and the unit capacitance of the MIM capacitor is determined according to the dielectric constant and a distance between the metal layer 201 and the conductive material layer 204. In other words, the semiconductor capacitor 106 of the present disclosure includes at least one metal layer to be served as a light reflection layer. To achieve better light reflection effect, the semiconductor capacitor 106 has an overlapping region OA with the light sensing region 102 (as shown in FIG. 3), and the overlapping region OA covers more than 30% of the light sensing region 102. In one embodiment, in order to reflect the light penetrating the substrate 101 but not being absorbed by the light sensing region 102, e.g. the light beam L shown in FIG. 3, the overlapping region OA overlaps a periphery of the light sensing region 102.

In the manufacturing process of a multi-metal layer, the MIM capacitor may be manufactured by selecting suitable metal layers without particular limitations. For example, the metal layers 201 and 202 may be formed by two metal layers in a metal stack layer (e.g. M2 and M3 metal layers, M3 and M4 metal layers), and the conductive material layer 204 made of conductive material is between the two metal layers to be served as one of the electrodes of the MIM capacitor.

In addition, a microlens 300 and/or a filter layer 400 may optionally be formed below the substrate 101, wherein the microlens 300 is used to control an incident direction of light entering the light sensing region 102, and the filter layer 400 is selected according to an absorption spectrum of the light sensing region 102, e.g. an infrared filter layer.

The present disclosure is adaptable to the light sensing device of various electronic shutters such as the rolling shutter or the global shutter. In the present disclosure, the signal-to-noise ratio and the dynamic range are improved and the noise is reduced.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A back side illuminated semiconductor structure comprising:
   a substrate having a light receiving surface;
   a light sensing region, inside the substrate, configured to receive light penetrating the substrate from the light receiving surface to generate photo-generated charges by a photoelectric effect;
   a floating diffusion node, inside the substrate, configured to temporarily store the photo-generated charges generated by the light sensing region;
   a transfer gate, connected to the light sensing region and the floating diffusion node, configured to control the photo-generated charges generated by the light sensing region to flow to the floating diffusion node; and
   a semiconductor capacitor comprising a first electrode and a second electrode, wherein
   the first electrode is electrically connected to the floating diffusion node and has an overlapping region with the light sensing region,
   the semiconductor capacitor is configured to temporarily store the photo-generated charges generated by the light sensing region together with the floating diffusion node, and
   the first electrode of the semiconductor capacitor is configured as a light reflection layer to reflect light not being absorbed in a first penetration of the light sensing region back to the light sensing region.

2. The semiconductor structure as claimed in claim 1, wherein the first and second electrodes of the semiconductor capacitor are formed by two metal layers of a metal stack layer.

3. The semiconductor structure as claimed in claim 1, wherein the overlapping region exceeds 30% of the light sensing region.

4. The semiconductor structure as claimed in claim 1, wherein the overlapping region overlaps with a periphery of the light sensing region.

5. The semiconductor structure as claimed in claim 1, wherein a cross section of the floating diffusion node is smaller than 20% of that of the light sensing region.

6. The semiconductor structure as claimed in claim 2, wherein a first metal layer is closest to the substrate among a plurality of metal layers in the metal stack layer, and the first and second electrodes of the semiconductor capacitor are not formed by the first metal layer.

7. A back side illuminated semiconductor structure comprising:
   a substrate having a light receiving surface;
   a light sensing region, inside the substrate, configured to receive light penetrating the substrate from the light receiving surface to generate photo-generated charges by a photoelectric effect;
   a floating diffusion node, inside the substrate, configured to temporarily store the photo-generated charges generated by the light sensing region;
   a transfer gate, connected to the light sensing region and the floating diffusion node, configured to control the photo-generated charges generated by the light sensing region to flow to the floating diffusion node; and
   a metal-insulator-metal capacitor comprising a first electrode and a second electrode, wherein
   the first electrode is electrically connected to the floating diffusion node,
   the metal-insulator-metal capacitor is configured to temporarily store the photo-generated charges generated by the light sensing region together with the floating diffusion node, and
   the first electrode is configured as a light reflection layer to reflect light not being absorbed in a first penetration of the light sensing region back to the light sensing region.

8. The semiconductor structure as claimed in claim 7, wherein the first and second electrodes of the metal-insulator-metal capacitor are formed by two metal layers of a metal stack layer.

9. The semiconductor structure as claimed in claim 8, wherein a first metal layer is closest to the substrate among a plurality of metal layers in the metal stack layer, and the first and second electrodes of the metal-insulator-metal capacitor are not formed by the first metal layer.

10. The semiconductor structure as claimed in claim 8, further comprising a conductive material layer between the two metal layers configured as the second electrode of the metal-insulator-metal capacitor.

11. A back side illuminated semiconductor structure comprising:
    a substrate having a light receiving surface;
    a light sensing region, inside the substrate, configured to receive light penetrating the substrate from the light receiving surface to generate photo-generated charges by a photoelectric effect;
    a floating diffusion node, inside the substrate, configured to temporarily store the photo-generated charges generated by the light sensing region;
    a transfer gate, connected to the light sensing region and the floating diffusion node, configured to control the photo-generated charges generated by the light sensing region to flow to the floating diffusion node; and
    a semiconductor capacitor comprising a first electrode and a second electrode, wherein
    the first electrode is electrically connected to the floating diffusion node through a contact,
    the semiconductor capacitor is configured to temporarily store the photo-generated charges generated by the light sensing region together with the floating diffusion node, a cross section of the floating diffusion node is 4 to 5 times of that of the contact, and the first electrode of the semiconductor capacitor is configured as a light reflection layer to reflect light not being absorbed in a first penetration of the light sensing region back to the light sensing region.

12. The semiconductor structure as claimed in claim 11, wherein the first and second electrodes of the semiconductor capacitor are formed by two metal layers of a metal stack layer.

13. The semiconductor structure as claimed in claim 11, wherein the first electrode of the semiconductor capacitor has an overlapping region with the light sensing region, and the overlapping region exceeds 30% of the light sensing region.

14. The semiconductor structure as claimed in claim 11, wherein the semiconductor capacitor is a metal-insulator-metal capacitor.

15. The semiconductor structure as claimed in claim 12, wherein a first metal layer is closest to the substrate among a plurality of metal layers in the metal stack layer, and the first and second electrodes of the semiconductor capacitor are not formed by the first metal layer.

16. The semiconductor structure as claimed in claim 13, wherein the overlapping region overlaps with a periphery of the light sensing region.

17. The semiconductor structure as claimed in claim 14, wherein the first electrode is a metal electrode of the metal-insulator-metal capacitor.

\* \* \* \* \*